(12) United States Patent
Rigolle et al.

(10) Patent No.: US 8,264,382 B2
(45) Date of Patent: Sep. 11, 2012

(54) KEYBOARD WITH A PLURALITY OF SENSITIVE KEY ELEMENTS

(75) Inventors: Thibaut Rigolle, Forli (IT); Andrea Rossi, Ravenna (IT); Laurent Jeanneteau, Compiegne (FR)

(73) Assignee: Electrolux Home Products Corporation N.V, Zaventem (BE)

( * ) Notice: Subject to any disclaimer, the term of this patent is extended or adjusted under 35 U.S.C. 154(b) by 338 days.

(21) Appl. No.: 12/745,767

(22) PCT Filed: Dec. 17, 2008

(86) PCT No.: PCT/EP2008/010755
§ 371 (c)(1),
(2), (4) Date: Jun. 2, 2010

(87) PCT Pub. No.: WO2009/089888
PCT Pub. Date: Jul. 23, 2009

(65) Prior Publication Data
US 2010/0259422 A1    Oct. 14, 2010

(30) Foreign Application Priority Data
Jan. 17, 2008    (EP) .................................... 08000799

(51) Int. Cl.
*H03K 17/94*    (2006.01)
(52) U.S. Cl. ......................................... 341/22; 400/489

(58) Field of Classification Search .................... 341/22, 341/23; 400/489, 486, 472, 484, 485; 361/679; 345/174, 168, 179
See application file for complete search history.

(56) References Cited

U.S. PATENT DOCUMENTS

| 2002/0015609 A1* | 2/2002 | Webber .................. 400/489 |
| 2006/0255971 A1 | 11/2006 | Kim |
| 2007/0273561 A1 | 11/2007 | Philipp |

FOREIGN PATENT DOCUMENTS
GB    2360740    10/2001

OTHER PUBLICATIONS
International Search Report for PCT/EP2008/010755, dated Jun. 4, 2009, 2 pages.

\* cited by examiner

*Primary Examiner* — Joseph Lauture
(74) *Attorney, Agent, or Firm* — Pearne & Gordon LLP

(57) ABSTRACT

The present invention relates to a keyboard with a plurality of sensitive key elements (10, 12, 14) arranged on said keyboard according to a predetermined scheme. Each of the key elements (10, 12, 14) provides an analogue electric signal (U1, U2, U3). The analogous electric signal (U1, U2, U3) depends on the position of a fingertip. A contact surface of the key element (12) is subdivided into zones (A, B, C, D). The zones (A, B, C, D) are defined in such a way, that the zones (A, B, C, D) have different distances from the adjacent key elements (10, 14). Each zone (A, B, C, D) corresponds with a range of relationships between the signal (U2) of the key element (12) and the signal (U1, U3) of at least one adjacent key element (10, 14).

15 Claims, 2 Drawing Sheets

KEYBOARD WITH A PLURALITY OF SENSITIVE KEY ELEMENTS

Figure 1:
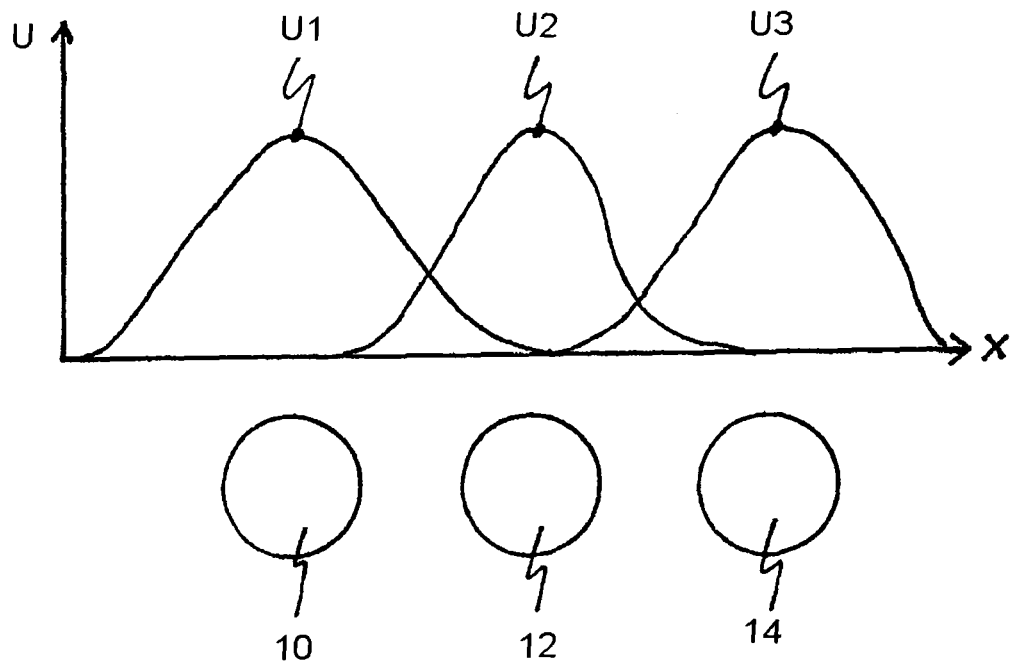

The present invention relates to a keyboard with a plurality of sensitive key elements according to claim 1.

A keyboard is usually used as an input apparatus. The keyboard includes a plurality of key elements arranged according to a predetermined scheme. Typical each key element comprises at least one sensor element. The sensor element may be sensitive to touch or proximity.

For example, each of the key elements is associated with an alphanumerical sign. In another type, the keyboard represents an area and each key element represents a geometric point on that keyboard. In this case the area is represented by quasi-continuous coordinates. The resolution of the area corresponds with the number of the key elements.

In order to characterize a geometrical point on such an area, for every defined point a key element or a sensor element, respectively, is required. This means a very large mechanical complexity of the keyboard.

It is an object of the present invention to provide a keyboard with a plurality of sensitive key elements, wherein the mechanical complexity is reduced.

This object is achieved by the system according to claim 1.

According to the present invention a keyboard with a plurality of sensitive key elements arranged on said keyboard according to a predetermined scheme is provided, wherein:
- each of the key elements provides an analogue electric signal,
- the analogous electric signal depends on the position of a fingertip;
- a contact surface of the key element is subdivided into zones,
- the zones are defined in such a way, that the zones have different distances from the adjacent key elements, and
- each zone corresponds with a range of relationships between the signal of the key element and the signal of at least one adjacent key element.

The core idea of the invention is the subdivision of the contact surface of the key elements into zones. By analyzing electric parameters, the single zones on the key elements may be identified. Thus, the number of the identifiable points on the keyboard is higher than the number of the key elements. This is a reduction of the mechanical parts of the keyboard.

Preferably, the key elements are coupled mechanically and/or electrically, so that an operated key element provides a predetermined signal and adjacent key elements provide signals lower than said predetermined signal. This supports the determination of a position on the contact surface of the key element.

The key elements may be provided as capacitive key elements. The capacity of each key element may depend on the touch intensity and/or the proximity of the finger. Further, said pressure sensitive key elements are coupled by capacitive coupling effects. In this case the direct operated key element provides a more intensive signal than the adjacent key elements.

Thus, the key elements may be provided as touch sensitive key elements and/or as proximity switches.

According to an embodiment of the present invention the key element is subdivided into two zones, wherein one of said zones is identifiable, if the signal from the key element adjacent to said zone is greater than the signal from the key element on the opposite side of said zone.

According to another embodiment of the present invention the key element is subdivided into three serial zones, wherein the lateral zones are identifiable, if the signal from the key element adjacent to said zone is greater than the signal from the key element on the opposite side of said zone and smaller than a predetermined fraction of the signal from the key element.

For example, the predetermined fraction is one-third. This value is suitable to identify one of the three zones.

According to further embodiment of the present invention the key element is subdivided into four serial zones, wherein the two inner zones are identifiable, if the signal from the key element adjacent to said zone is greater than the signal from the key element on the opposite side of said zone.

Further, the two outer zones are identifiable, if the signal from the key element adjacent to said zone is greater than the signal from the key element on the opposite side of said zone and smaller than a predetermined fraction of the signal from the key element. For example, the predetermined fraction is one half. This value is suitable to identify one of the four zones.

In general, the contact surface of the key element may be two-dimensionally subdivided into a plurality of zones. This allows a higher resolution along both directions within the plane of the keyboard. The key elements may be arranged in a matrix form. In this case the position of the finger can be detected in the two dimensional plane.

Further, the signal from the key element is a continuous voltage peak.

The runtimes of the voltage peaks may be associated with the key elements. Since the lengths of the lines to the key elements are different, the key elements have per se different runtimes. This property may be used to identify the key element by its runtime.

The novel and inventive features believed to be the characteristic of the present invention are set forth in the appended claims.

Figure 2:
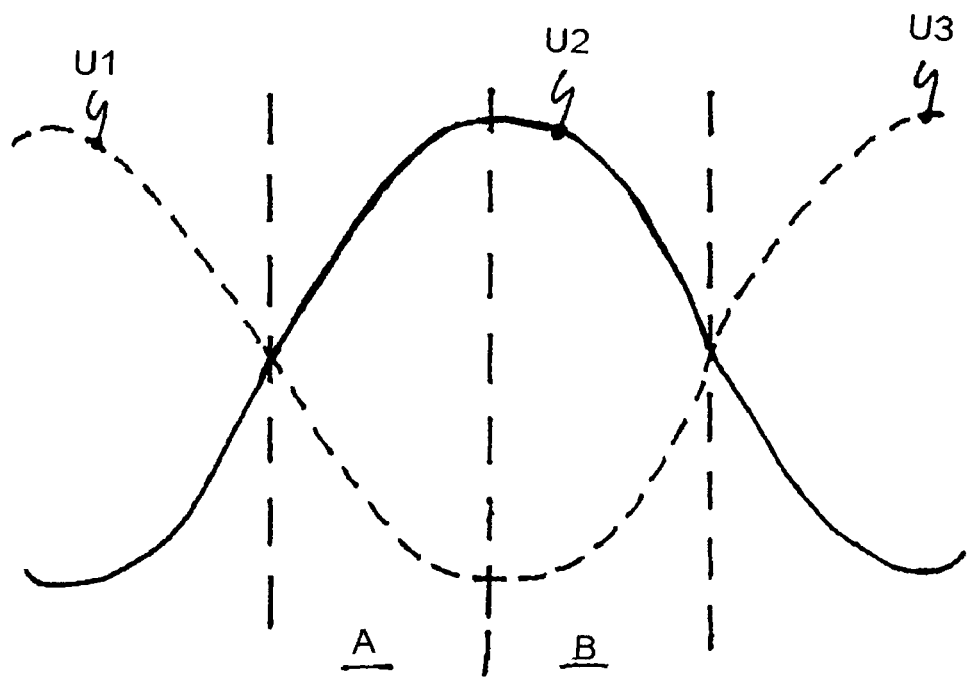
Figure 3:
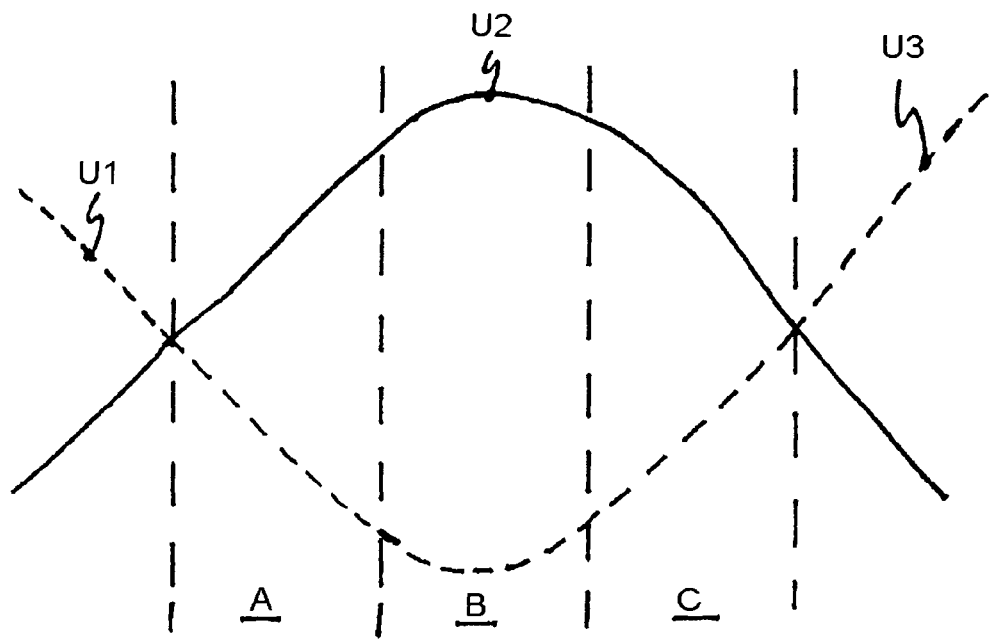
Figure 4:
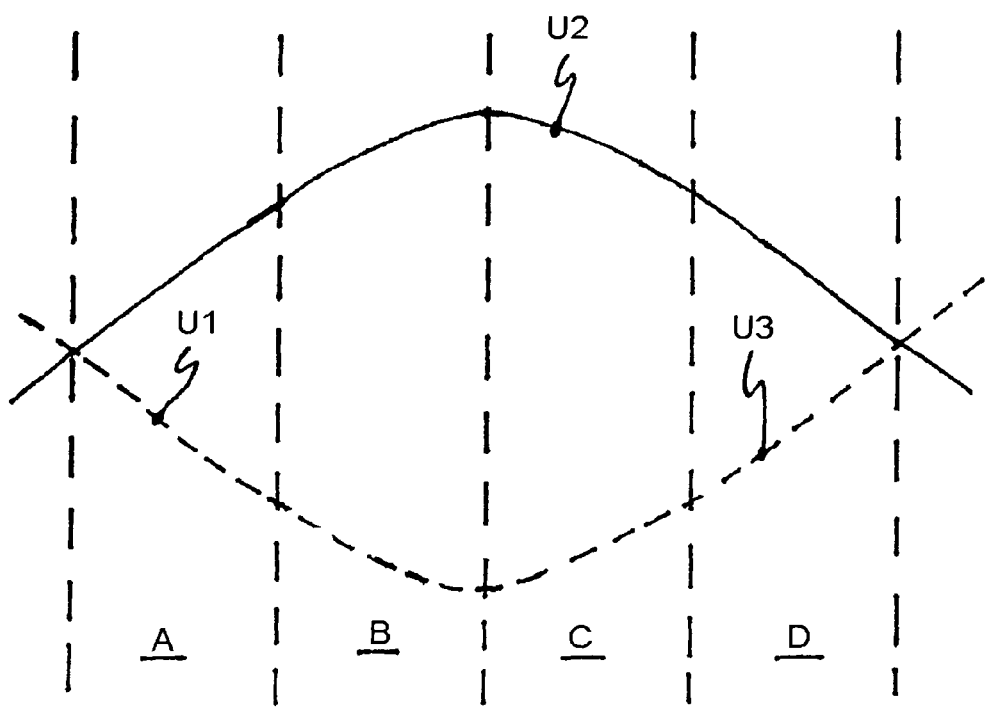

The invention will be described in further detail with reference to the drawing, in which FIG. 1 illustrates a schematic diagram of three serial key elements and a corresponding voltage-space-diagram according to a preferred embodiment of the present invention, FIG. 2 illustrates a schematic diagram of a contact surface and a corresponding voltage-space-diagram according to a first embodiment of the present invention, FIG. 3 illustrates a schematic diagram of a contact surface and a corresponding voltage-space-diagram according to a second embodiment of the present invention, and FIG. 4 illustrates a schematic diagram of a contact surface and a corresponding voltage-space-diagram according to a third embodiment of the present invention.

FIG. 1 illustrates a schematic diagram of a system of three adjacent keys 10, 12 and 14 and a corresponding voltage-space-diagram according to a first embodiment of the present invention. In this example the three key elements 10, 12 and 14 are ordered along a line. The voltage-space-diagram shows the voltage U as a function of one space dimension x. In a preferred embodiment said voltage U represents an image of a capacitive touch.

The voltage-space-diagram comprises three signals U1, U2 and U3. The signals U1, U2 and U3 correspond with the three key elements 10, 12 and 14. The signals U1, U2 and U3 are voltage peaks, which have their maxima at different x-values. Since the electric lines between the key elements 10, 12 and 14 and a processing circuit have different runtimes, the maxima of the peaks of the signal U1, U2 and U3 have different x-values. In the preferred embodiment said peak is the result of the position of the finger. If the finger is exactly on the surface of the key element 10, 12 and 14, then the signal will have the highest level.

A touch or a pressure or any other action onto the key elements 10, 12 or 14 provide a clear signal U1, U2 or U3, respectively. In the preferred embodiment the key elements 10, 12 and 14 are capacitive touch elements including a spring, an electronic detection circuit and a software treatment.

The adjacent key elements 10, 12 and 14 are coupled by a capacitive effect. If a finger is close, e.g. less than 10 mm, to the border of the centre key element 12, then the voltage signal U2 will start to see a capacitive modification. The voltage signal U2 will be at the peak, when the finger covers the key element 12. Using this effect, if the adjacent key element 10 is put at 3 mm of the border of the key element 12, when the finger will be on the key element 12, then the voltage signal U2 will be at the peak and additionally the voltage signal U1 will be impacted by the adjacent capacitive effect.

FIG. 2 illustrates a schematic diagram of a contact surface and a corresponding voltage-space-diagram according to a first embodiment of the present invention. In this example each of the key elements 10, 12 and 14 is divided into two zones, namely into a first zone A and a second zone B. The first zone A is closer to the first key element 10. The second zone B is closer to the third key element 14.

The key elements 10, 12 and 14 are coupled mechanically and/or electrically together in such a way, that the adjacent lateral key elements 10 and 14 provide the signals U1 and U3, if the central key element 12 is operated. The signals U1 and U3 of the adjacent lateral key elements 10 and 14 depend on the position on the contact surface of the central key element 12, which is touched by the operator.

The values of the signals U1, U2 and U3 may depend on the position of a finger touching the second key element 12. If the first signal U1 is greater than the third signal U3, then the finger touches the first zone A. If the first signal U1 is smaller than the third signal U3, then the finger touches the second zone B.

FIG. 3 illustrates a schematic diagram of a contact surface and a corresponding voltage-space-diagram according to a second embodiment of the present invention. In this example each of the key elements 10, 12 and 14 is divided into three zones, namely into a first zone A, a second zone B and a third zone C. The first zone A is closer to the first key element 10. The second zone B is in the centre between the first key element 10 and the second the first key element 14. The third zone C is closer to the third key element 14.

If the central key element 12 is operated, then also the key elements 10 and 14 provide the signals U1 and U3. The intensity of the signals U1 and U3 depend on the zone A, B or C, which is touched by the operator.

If the first signal U1 is greater than one-third of the second signal U2, then the first zone A is touched by the operator. If the third signal U3 is greater than one-third of the second signal U2, then the third zone C is touched by the operator. If both of the signals U1 and U3 are smaller than one-third of the second signal U2, then the second zone B is touched by the operator.

FIG. 4 illustrates a schematic diagram of a contact surface and a corresponding voltage-space-diagram according to a third embodiment of the present invention. In this example each of the key elements 10, 12 and 14 is divided into four zones, namely into a first zone A, a second zone B, a third zone C and a second zone D. The first zone A is an outer zone and closer to the first key element 10. The second zone B is an inner zone and closer to the first key element to 10. The third zone C is an inner zone and closer to the third key element 14. The fourth zone D is an outer zone and closer to the third key element 14.

If the first signal U1 is smaller than a half of the second signal U2, then the first zone A is touched by the operator. If the first signal U1 is greater than the third signal U3, then the second zone B is touched by the operator. If the third signal U3 is greater than the first signal U1, then the third zone C is operated. If the third signal U3 is smaller than a half of the second signal U2, then the fourth zone D is operated.

The key elements 10, 12 and 14 may include electrical and/or mechanical elements. For example, the key elements 10, 12 and 14 comprises one or more sensors for. detecting physical quantities, like temperature, pressure, brightness, weight and so on. Further, the key elements. 10, 12 and 14 may be a manual switch. In the preferred embodiment of the present invention the key elements 10, 12 and 14 are touch sensitive keys. In general, the key elements 10, 12 and 14 may be an arbitrary device, which provides the signal U describing a state and/or a value. In particular, the signal U is formed as an analogous voltage signal.

The present invention can also be embedded in a computer program product, which comprises all the features enabling the implementation of the method described herein.

Although illustrative embodiments of the present invention have been described herein with reference to the accompanying drawing, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

List of Reference Numerals
10 first key element
12 second key element
14 third key element
U1 first signal
U2 second signal
U3 third signal
A first zone
B second zone
C third zone
D fourth zone

The invention claimed is:

1. A keyboard with a plurality of sensitive key elements (10, 12, 14) arranged on said keyboard according to a predetermined scheme, wherein:
each of the key elements (10, 12, 14) provides an analog electric signal (U1, U2, U3),
the analog electric signal (U1, U2, U3) depends on the position of a fingertip,
a contact surface of the key element (12) is subdivided into zones (A, B, C, D),
the zones (A, B, C, D) are defined in such a way, that the zones (A, B, C, D) have different distances from the adjacent key elements (10, 14), and
each zone (A, B, C, D) corresponds with a range of relationships between the signal (U2) of the key element (12) and the signal (U1, U3) of at least one adjacent key element (10, 14).

2. The keyboard according to claim 1, characterized in, that the key elements (10, 12, 14) are coupled mechanically and/or electrically, so that an operated key element (12) provides a predetermined signal (U2) and adjacent key elements (10, 14) provide signals (U1, U3) lower than said predetermined signal (U2).

3. The keyboard according to claim 1, characterized in, that the key elements (10, 12, 14) are capacitive key elements.

4. The keyboard according to claims 1, characterized in, that the key elements (10, 12, 14) are coupled by a capacitive coupling effect.

5. The keyboard according to claim 1, characterized in, that the key elements (10, 12, 14) are touch sensitive key elements.

6. The keyboard according to claim 1, characterized in, that the key elements (10, 12, 14) are proximity switches.

7. The keyboard according to claim 1, characterized in, that the key element (12) is subdivided into two zones (A, B), wherein one of said zones (A, B) is identifiable, if the signal (U1, U3) from the key element. (10, 14) adjacent to said zone (A, B) is greater than the signal (U3, U1) from the key element (14, 10) on the opposite side of said zone (A, B).

8. The keyboard according to claim 1, characterized in, that the key element (12) is subdivided into three serial zones (A, B, C) , wherein the lateral zones (A, C) are identifiable, if the signal (U1, U3) from the key element (10, 14) adjacent to said zone (A, C) is greater than the signal (U3, U1) from the key element (14, 10) on the opposite side of said zone (A, B) and smaller than a predetermined fraction of the signal (U2) from the key element (12).

9. The keyboard according to claim 8, characterized in, that the predetermined fraction is one-third.

10. The keyboard according to claim 1, characterized in, that the key element (12) is subdivided into four serial zones (A, B, C, D), wherein the two inner zones (B, C) are identifiable, if the signal (U1, U3) from the key element (10, 14) adjacent to said zone (A, C) is greater than the signal (U3, U1) from the key element (14, 10) on the opposite side of said zone (A, B).

11. The keyboard according to claim 10, characterized in, that the two outer zones (A, D) are identifiable, if the signal (U1, U3) from the key element (10, 14) adjacent to said zone (A, D) is greater than the signal (U3, U1) from the key element (14, 10) on the opposite side of said zone (A, B) and smaller than a predetermined fraction of the signal (U2) from the key element (12).

12. The keyboard according to claim 1, characterized in, that the contact surface of the key element (12) is two- dimensionally subdivided into a plurality of zones.

13. The keyboard according to claim 1, characterized in, that the key elements (10, 12, 14) are arranged in a matrix form.

14. The keyboard according to claim 1, characterized in, that the signal (U1, U2, U3) from the key element (10, 12, 12) is a continuous voltage peak.

15. The keyboard according to claim 1, characterized in, that the runtimes of the voltage peaks (U1, U2, U3) are associated with the key elements (10, 12, 14).

* * * * *